(12) United States Patent
Cummings et al.

(10) Patent No.: US 11,823,811 B2
(45) Date of Patent: Nov. 21, 2023

(54) HIGH-DENSITY CRYOGENIC WIRING FOR SUPERCONDUCTING QUBIT CONTROL

(71) Applicant: Massachusetts Institute of Technology, Cambridge, MA (US)

(72) Inventors: John D. Cummings, Stoneham, MA (US); John A. Rokosz, Belmont, MA (US); Kyle J. Thompson, Boulder, CO (US); Steven J. Weber, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/579,047

(22) Filed: Jan. 19, 2022

(65) Prior Publication Data

US 2022/0230785 A1     Jul. 21, 2022

Related U.S. Application Data

(60) Provisional application No. 63/140,093, filed on Jan. 21, 2021.

(51) Int. Cl.
*H01B 12/06* (2006.01)
*H01B 7/04* (2006.01)

(52) U.S. Cl.
CPC ............... *H01B 12/06* (2013.01); *H01B 7/04* (2013.01)

(58) Field of Classification Search
CPC ........ H01B 7/08; H01B 11/02; H01B 7/0823; H01B 7/1875; H01B 7/324; H01B 11/00; H01B 7/04; H01B 7/0861; H01B 11/1808; H01B 5/10; H01B 7/0225; H01B 7/292; H01B 11/12; H01B 11/18; H01B 11/1847; H01B 13/008; H01B 17/36; H01B 7/06; H01B 1/026; H01B 11/002; H01B 11/005;
(Continued)

(56) References Cited

U.S. PATENT DOCUMENTS 4,824,737 A * 4/1989 Hiesbock ............... B32B 15/01
                                                                428/645
5,090,116 A * 2/1992 Henschen .............. H01R 43/16
                                                                439/876
(Continued)

FOREIGN PATENT DOCUMENTS

NL       2024042 A     5/2020
NL       2024052 B1    6/2021

OTHER PUBLICATIONS

CMR-Direct, Cryogenic Wiring. 2 pages, 2021.
(Continued)

*Primary Examiner* — Krystal Robinson
(74) *Attorney, Agent, or Firm* — NIELDS, LEMACK & FRAME, LLC (57) ABSTRACT

A high density wiring system to transmit radio frequency (RF) signals to superconducting qubits disposed within a dilution refrigerator is disclosed. The high density wiring system comprises a plurality of flexible layers, with conductive layers disposed between adjacent pairs of flexible layers. The conductive layers may be constructed using phosphor bronze. The wiring system that is disposed at the lower temperature stages of the dilution refrigerator may be coated with a superconducting material. The wiring system is useful for superconducting quantum computers and cryogenic sensors, as well as cryogenic infrastructure.

20 Claims, 8 Drawing Sheets

(58) Field of Classification Search
CPC .. H01B 11/1869; H01B 11/203; H01B 12/06; H01B 17/58; H01B 7/0009; H01B 7/02; H01B 7/0216; H01B 7/0807; H01B 7/0838; H01B 7/18; H01B 7/29; H01B 9/006; H01B 1/02; H01B 11/1839; H01B 11/1878; H01B 13/0036; H01B 13/14; H01B 13/144; H01B 9/0611
See application file for complete search history.

(56) References Cited

U.S. PATENT DOCUMENTS

| | | | | |
|---|---|---|---|---|
| 5,190,473 | A * | 3/1993 | Mroczkowski | H01R 13/6585 |
| | | | | 439/580 |
| 5,807,133 | A * | 9/1998 | Arnett | H01R 4/2404 |
| | | | | 439/441 |
| 10,453,592 | B1 * | 10/2019 | Smith | H01B 12/16 |
| 10,734,696 | B2 | 8/2020 | El Bouayadi et al. | |
| 2006/0099727 | A1 * | 5/2006 | Konrad | H05K 3/243 |
| | | | | 438/14 |
| 2018/0294401 | A1 * | 10/2018 | Tuckerman | H10N 60/80 |
| 2018/0348286 | A1 * | 12/2018 | Tetsuno | G01R 31/70 |
| 2019/0042968 | A1 * | 2/2019 | Lampert | H01L 29/66439 |
| 2021/0325791 | A1 | 10/2021 | Ma et al. | |
| 2022/0230785 | A1 * | 7/2022 | Cummings | H01B 12/06 |

OTHER PUBLICATIONS

Delft Circuits, Datasheet, Cri/oFlex1. 2 pages, Jul. 29, 2021.
Delft Circuits, Datasheet, Cri/oFlex2. 2 pages, Jul. 29, 2021.
Lake Shore Cryotronics, Inc., Cryogenic Wire Catalog. 4 pages., 2021.
Lipski et al., Recent Work on Lead-tin Superconducting Surfaces. Proceedings of the 1995 Workshop on RF Superconductivity. 5 pages, 1995.
Lobanov et al., Lead Plating: ANU SLRS Upgrade. Proceedings of the 1999 Workshop on RF Superconductivity. 14 pages, 1999.
MWS Wire Industries, Plated Wire and Ribbon. One page, May 2016.
Roust et al., Electroplated Solder for Superconductor Application. Lawrence Livermore Laboratory. 9 pages, Sep. 14, 1976.
Weber et al., Scaling up package I/O for superconducting quibits. 2019 APS March Meeting. One page, 2019.
Wen Cheng Lead Wire Co Ltd, Tin Plated Phosphor Bronze Wire c5100 & c5191. 3 pages, 2021.

* cited by examiner

HIGH-DENSITY CRYOGENIC WIRING FOR
SUPERCONDUCTING QUBIT CONTROL

This application claims priority of U.S. Provisional Patent Application Ser. No. 63/140,093, filed Jan. 21, 2021, the disclosure of which is incorporated herein by reference in its entirety.

This invention was made with Government support under Grant No. FA8702-15-D-0001 awarded by the United State Air Force. The Government has certain rights in the invention.

FIELD

This disclosure describes high density wiring, particular high density wiring for cryogenic applications.

BACKGROUND

Quantum computing is gaining momentum as a potentially revolutionary platform for high-performance computing. Several companies have demonstrated intermediate-scale systems having roughly 50 quantum bits. Companies are investing more money into scaling these systems. To achieve quantum computing, the quantum bits, which are commonly referred to as qubits, must be maintained at extremely low temperatures. In some embodiments, the temperature must be less than 0.1 degree Kelvin.

These low temperatures are typically achieved using dilution refrigerators. A dilution refrigerator relies on a mixture of 3He and 4He isotopes. The lighter 3He isotopes are pumped out from a 3He poor zone and pumped into the 3He rich zone. This affects the equilibrium of the mixture which causes a cooling effect.

In most embodiments, the dilution refrigerator has a number of stages, where each inner stage is maintained at a lower temperature than the stage that surrounds it. In some embodiments, there may be 4-6 stages.

One of the issues associated with quantum computing is providing electrical connections to the qubits.

Traditional approaches to cryogenic wiring can be generally divided into two categories: DC wiring and coaxial cables. DC wiring typically comprises twisted-pair wires or unshielded ribbon cables. This approach can achieve high wiring density, but with insufficient RF performance (bandwidth and isolation) for quantum computing applications. In contrast, coaxial cables have excellent RF performance, but they are costly, low-density, and can cause excessive heating.

Therefore, it would be advantageous if there were a wiring system that could be used for interconnecting qubits in a quantum computer. Further, it would be beneficial if such a wiring system was high density to allow the introduction of hundreds of signals.

SUMMARY

A high density wiring system to transmit radio frequency (RF) signals to superconducting qubits disposed within a dilution refrigerator is disclosed. The high density wiring system comprises a plurality of flexible layers, with conductive layers disposed between adjacent pairs of flexible layers. The conductive layers may be constructed using phosphor bronze. The wiring system that is disposed at the lower temperature stages of the dilution refrigerator may be coated with a superconducting material. The wiring system is useful for superconducting quantum computers and cryogenic sensors, as well as cryogenic infrastructure.

According to one embodiment, a flexible wiring system for use within a dilution refrigerator is disclosed. The flexible wiring system comprises a flex cable comprising two interior flexible layers between which signal traces are disposed, wherein the signal traces comprise phosphor bronze coated with a superconducting material. In some embodiments, the superconducting material comprises a tin-lead solder layer applied using a hot air solder leveling (HASL) process. In some embodiments, the flexible wiring system comprises two outer flexible layers sandwiching the two interior flexible layers, wherein outer conductive layers are disposed between each outer flexible layer and an adjacent interior flexible layer. In some embodiments, the outer conductive layers are made of phosphor bronze and act as ground planes. In some embodiments, the signal traces have a bandwidth of at least 50 MHz. In some embodiments, isolation between signal traces is greater than 40 dB. In some embodiments, each signal trace is configured to carry at least 3 mA of current.

According to another embodiment, a flexible wiring system for use within a dilution refrigerator is disclosed, wherein the dilution refrigerator comprises a plurality of stages, each at a different temperature, separated by inter-stage regions. The flexible wiring system comprises one or more flex cables in a higher temperature wiring system used in stages and inter-stage regions having a temperature above a threshold temperature; one or more flex cables in a lower temperature wiring system used in stages and inter-stage regions having a temperature less than the threshold temperature; and a connector to connect the one or more flex cables in the higher temperature wiring system and the one or more flex cables in the lower temperature wiring system. In certain embodiments, the threshold temperature is between 3K and 5K. In some embodiments, the one or more flex cables in the higher temperature wiring system and the one or more flex cables in the lower temperature wiring system comprise two interior flexible layers wherein signal traces are disposed between the two interior flexible layers, and are made of phosphor bronze. In some embodiments, the signal traces have a bandwidth of at least 50 MHz. In some embodiments, isolation between signal traces is greater than 40 dB. In some embodiments, each signal trace is configured to carry at least 3 mA of current. In some embodiments, the one or more flex cables in the higher temperature wiring system and the one or more flex cables in the lower temperature wiring system each further comprise two outer flexible layers sandwiching the two interior flexible layers, wherein outer conductive layers are disposed between each outer flexible layer and an adjacent interior flexible layer, wherein the outer conductive layers are made of phosphor bronze and act as ground planes. In some embodiments, the one or more flex cables in the lower temperature wiring system comprises a material disposed on the signal traces, and wherein the material is superconducting below the threshold temperature. In certain embodiments, the material is not disposed on the signal traces in the higher temperature wiring system. In some embodiments, the material comprises a tin-lead solder layer. In some embodiments, the material comprises a tin layer. In some embodiments, the flexible wiring system comprises a filter board used to connect two adjacent flex cables, wherein the filter board comprises low pass filters.

BRIEF DESCRIPTION OF THE DRAWINGS

For a better understanding of the present disclosure, reference is made to the accompanying drawings, in which like elements are referenced with like numerals, and in which.

DETAILED DESCRIPTION

According to one embodiment, a high density cryogenic wiring system for superconducting qubit control is disclosed.

Figure 1A:
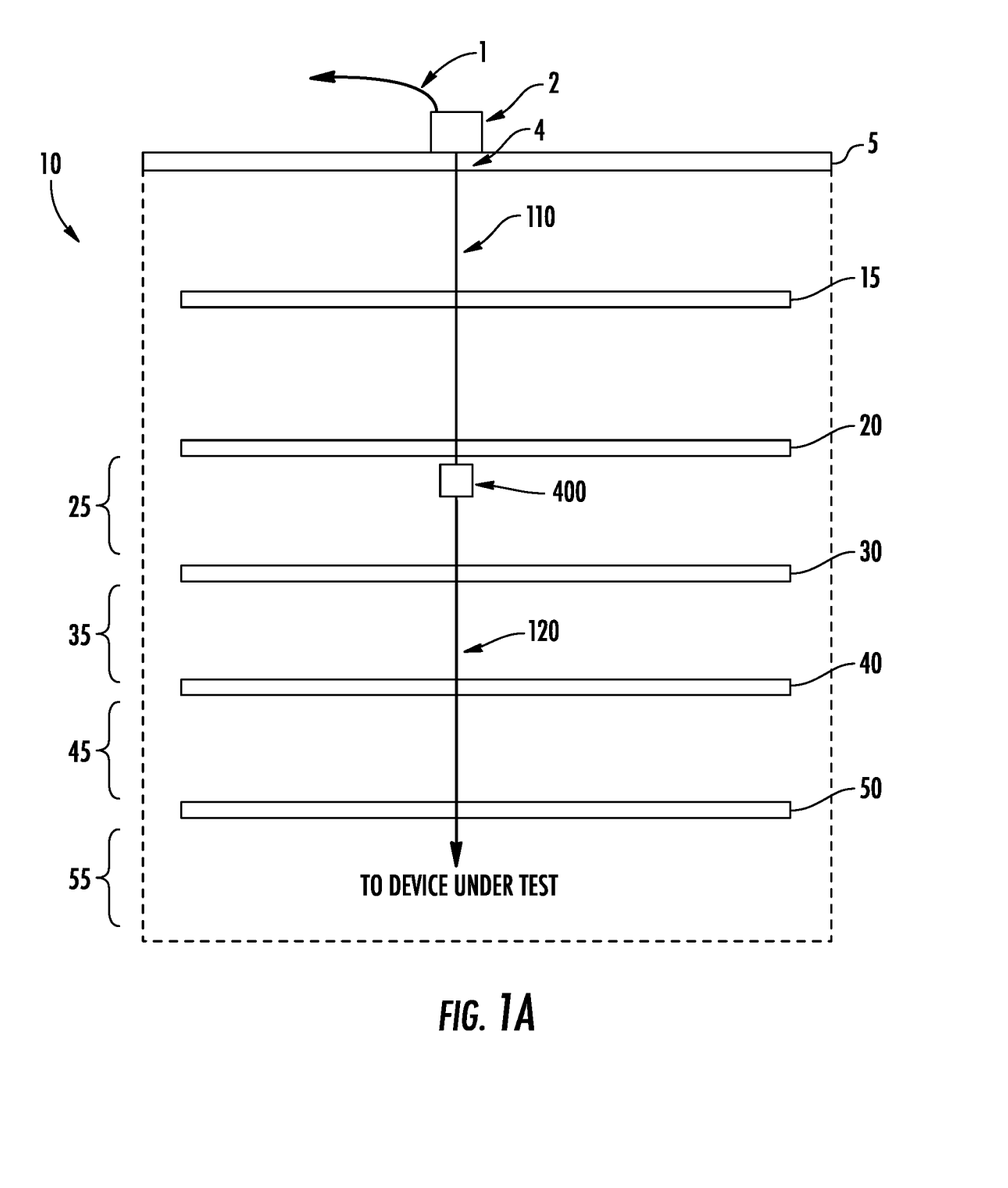
FIG. 1A shows a dilution refrigerator with multiple stages.
Figure 1B:
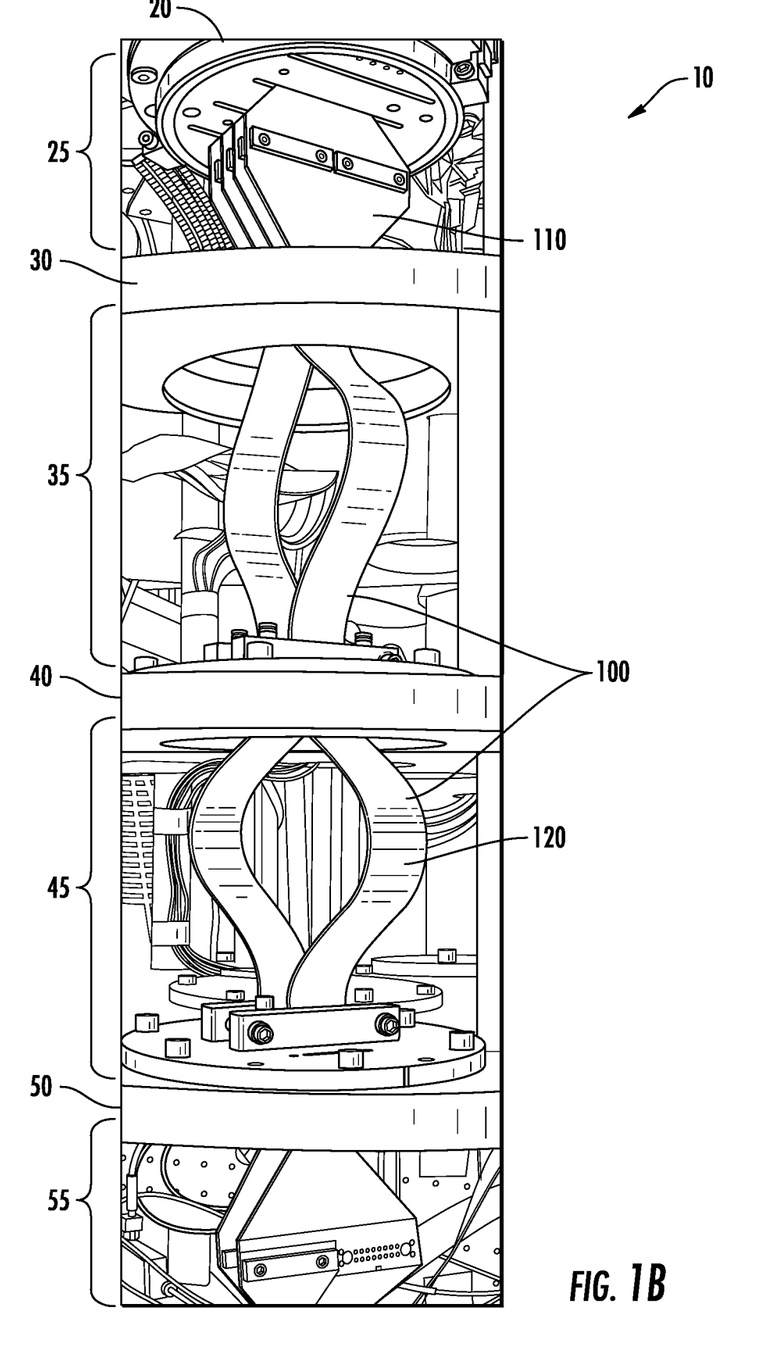
FIG. 1B shows a detailed illustration of some of the stages in the dilution refrigerator.
Figure 1C:
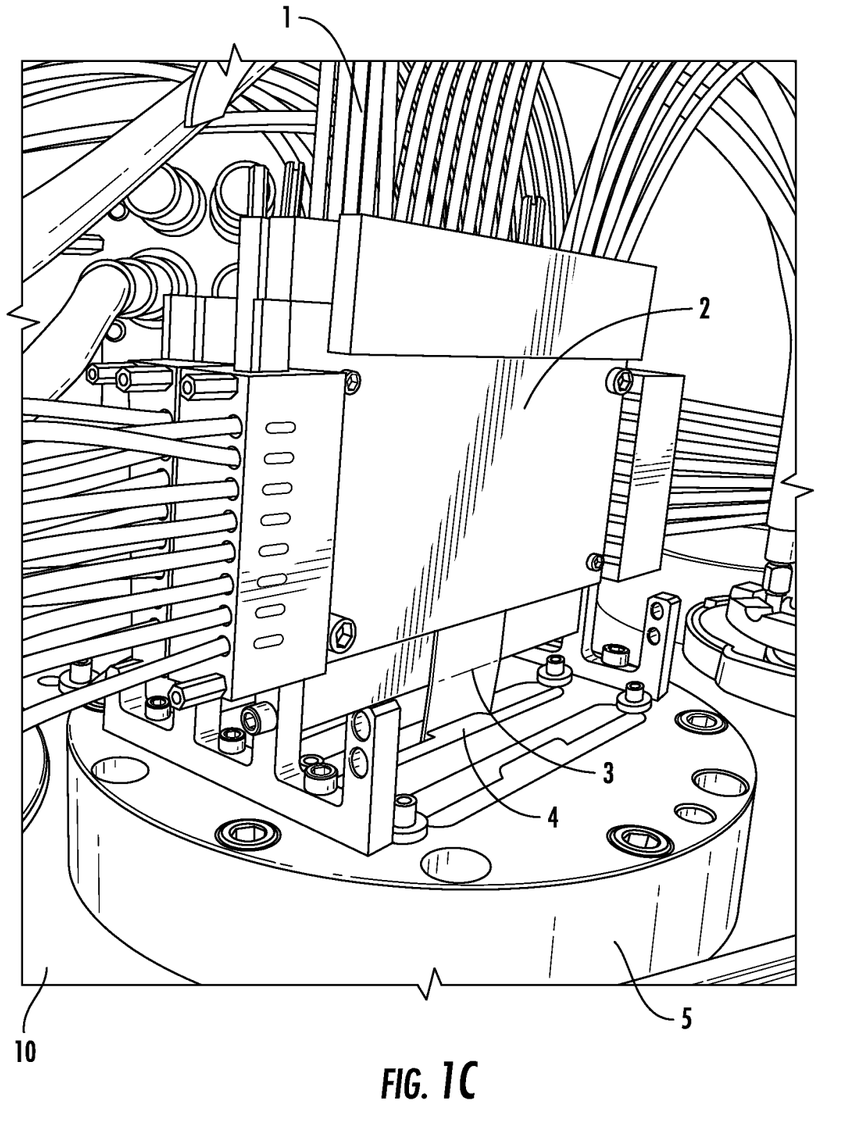
FIG. 1C shows the connections at the top of the dilution refrigerator.

FIG. 1A shows a block diagram of a dilution refrigerator 10. FIG. 1B shows a detailed view of some of the descending temperature stages of a dilution refrigerator 10 and the wiring system disclosed herein. FIG. 1C shows the connections at the top of the dilution refrigerator 10. As shown in FIGS. 1A and 1C, the electrical signals that are external to the dilution refrigerator 10 may be contained within coaxial cables 1. The coaxial cables 1 may all be connected to a rigid backing board 2. The rigid backing board 2 may include signal traces to conduct the signals from the coaxial cables 1 and connect them to a flex assembly 3. This flex assembly may be considered to be part of the high density wiring system. The flex assembly 3 then passes through a hermetically sealed opening 4 and enters the dilution refrigerator 10 through a flange 5.

As shown in FIG. 1A, the dilution refrigerator 10 may be several stages, each maintained at a lower temperature than the previous stage. In some embodiments, there may be 4 or more stages. For example, the exterior may be at room temperature, which is roughly 300K. The first stage 15 may be maintained at 40K-50K, the second stage 20 may be maintained at 4K, the third stage 30 may be maintained at roughly 800 mK, the fourth stage 40 may be maintained between 50 mK and 100 mK and the final stage 50 may be maintained at 15 mK.

The temperatures of each stage may vary from those described herein. This is intended to illustrate the structure of the dilution refrigerator 10 and not the exact temperature specifications.

Each stage comprises a plate and a flange. In some stages, the flange may be a vacuum flange. In other stages, the flange may be a radiation shield. Each stage is separated from the adjacent stage by an inter-stage region. Each inter-stage region has a temperature gradient. For example, the second stage 20 and the third stage 30 are separated by second inter-stage region 25. Therefore, the temperature in the second inter-stage region 25 is less than or equal to that of the second stage 20. The third stage 30 and the fourth stage 40 are separated by the third inter-stage region 35. Therefore, the temperature in the third inter-stage region 35 is less than or equal to that of the third stage 30. The fourth stage 40 and the final stage 50 are separated by fourth inter-stage region 45. Therefore, the temperature in the fourth inter-stage region 45 is less than or equal to that of the fourth stage 40. Region 55 is thermalized to the temperature of the final stage 50. The device under test or quantum computer is disposed in the region 55.

A high density wiring system 100 is used to connect these various stages. In certain embodiments, higher temperature wiring systems 110 may be used in the stages and inter-stage regions with temperatures greater than a threshold temperature. Lower temperature wiring systems 120 may be used in stages and inter-stage regions with temperatures less than the threshold temperature. In some embodiments, this threshold temperature is about 4K. In other embodiments, the threshold temperature may be between 3K and 5K. As shown in FIG. 1C, at the top of the dilution refrigerator 10, coaxial cables 1 may be used to supply the signals to the high density wiring system.

Figure 2:
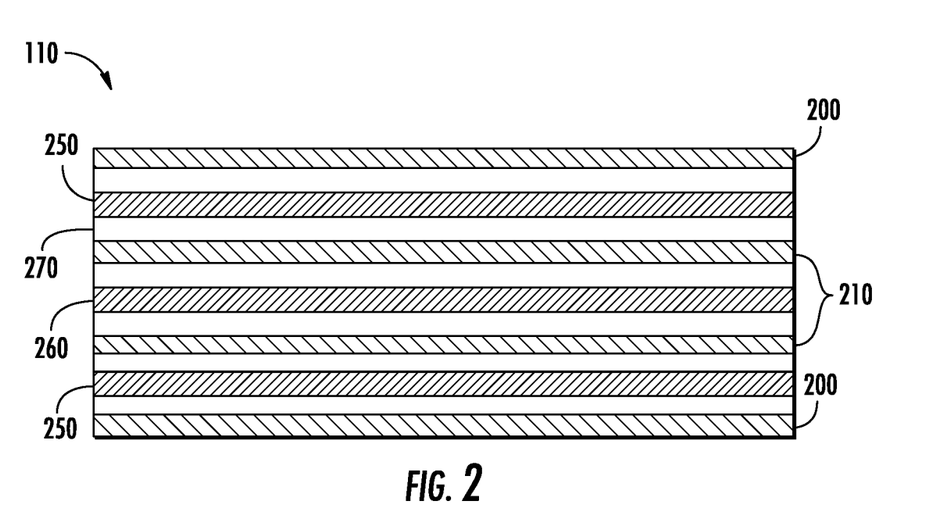
FIG. 2 shows a cross-section of one flex cable of the higher temperature wiring system.

FIG. 2 shows the cross-section associated with one flex cable of this high density wiring system. A flex cable is defined as a section of the high density wiring system that traverses one or more stages of the dilution refrigerator and connects to another flex cable or to the device under test.

The higher temperature wiring system 110 comprises one or more flex cables, each having two to four layers of a flexible material, such as polyimide. In certain embodiments, there are two outer flexible layers 200 and two interior flexible layers 210. The outer flexible layers 200 may be thinner than the interior flexible layers 210. For example, the outer flexible layers may be 0.472 mil (12 μm) thick, while the interior flexible layers 210 may be 3 mil (76.2 μm) thick. Of course, different thicknesses may be used. A conductive layer is disposed between each pair of adjacent flexible layers. For example, an outer conductive layer 250 is disposed between each outer flexible layer 200 and the adjacent interior flexible layer 210. Between the two interior flexible layers 210 is an inner conductive layer 260. All of the conductive layers may be made of phosphor bronze. The outer conductive layers 250 may be solid contiguous layers and form ground planes. An adhesive layer 270 may be disposed between each pair of adjacent conductive layers and flexible layers.

Figure 3:
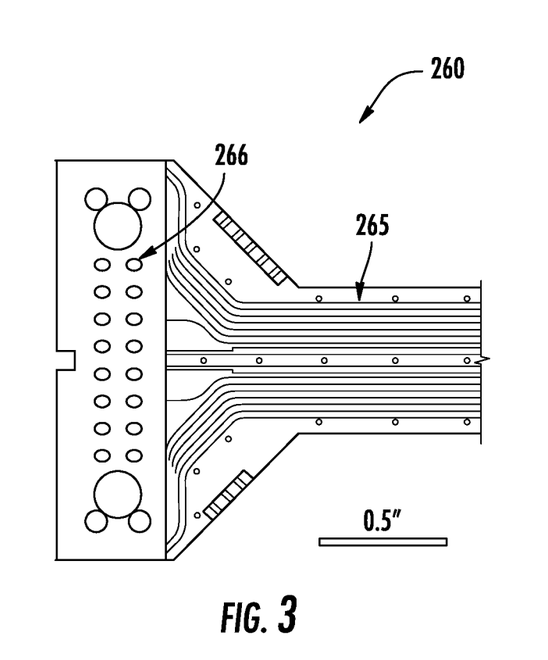
FIG. 3 shows a top view of one flex cable of the high density wiring system.

In contrast, the inner conductive layer 260 may be etched to form individual signal traces. FIG. 3 shows a top view of the inner conductive layer of the high density wiring according to one embodiment. To create the individual signal traces, an adhesive layer 270 is applied to a surface of the interior flexible layer 210. A layer of phosphor bronze is then deposited on the adhesive layer 270. After deposition, a standard lithography process is performed to form the individual signal traces 265. In certain embodiments, the signal traces 265 may be 5 mil thick and spaced apart by about 20 mil. In certain embodiments, 32 signal traces or more may be formed on the inner conductive layer 260 of a flex cable. Thus, each flex cable is capable of carrying 32 or more signal traces.

The signal traces 265 may be designed to have a nominal 50 ohm impedance. Additionally, the spacing between signal traces may be such that the spacing results in greater than 40 dB isolation at frequencies up to 1 GHz. In certain embodiments, the isolation is greater than 50 dB. In other embodiments, the isolation is greater than 60 dB. Further, each signal trace 265 is capable of carrying up to 3 mA of current.

The bandwidth of the signal traces 265 is greater than 50 MHz. In some embodiments, the bandwidth of the signal traces 265 may be greater than 150 MHz.

The adhesive layers 270 between the conductive layers and the interior flexible layers 210 may be 1 mil (25.4 μm) thick. Additionally, the adhesive layers 270 between the outer flexible layers 200 and the outer conductive layers 250 may be 0.590 mil (15 μm) thick. Again, other dimensions may be used. However, based on the dimensions provided above, the total thickness of the higher temperature wiring system 110 may be about 14 mils (358 μm).

In other embodiments, the two outer flexible layers 200 may be omitted. In these embodiments, the flex cable comprises two interior flexible layers 210, an inner conductive layer 260, and one or more adhesive layers 270. As described above, the signal traces 265 are created on the inner conductive layer 260.

The conductive layers in the flex cables in the high density wiring system contribute heat to the dilution refrigerator in two ways.

First, any signal carrying current will dissipate heat, which can be calculated based on the length of the signal trace, the electrical resistivity of the conducting material, and the amount of current that is being delivered. Throughout this disclosure, this type of heating may be referred to as active heating.

Second, each signal trace also carries the heat associated with the warmer stage from which it originated. For example, a flex cable of the wiring system may start in a stage having a temperature of 4K and terminate in a stage having a temperature of 1K. Since part of the wiring system is disposed in a 4K environment, the conductive layers carry heat from this environment into the colder stage. In this disclosure, this is referred to as passive heating as it is not related to current flow.

Phosphor bronze was selected for the conductive layers due to its low thermal conductivity. At 80K, its thermal conductivity is about 25 W/mK, as compared to copper, which has a thermal conductivity of 600 W/mK at the same temperature. Its thermal conductivity decreases at lower temperatures. Therefore, the use of phosphor bronze (as compared to copper or another metal) significantly reduces the heat generated due to passive heating.

Figure 4:
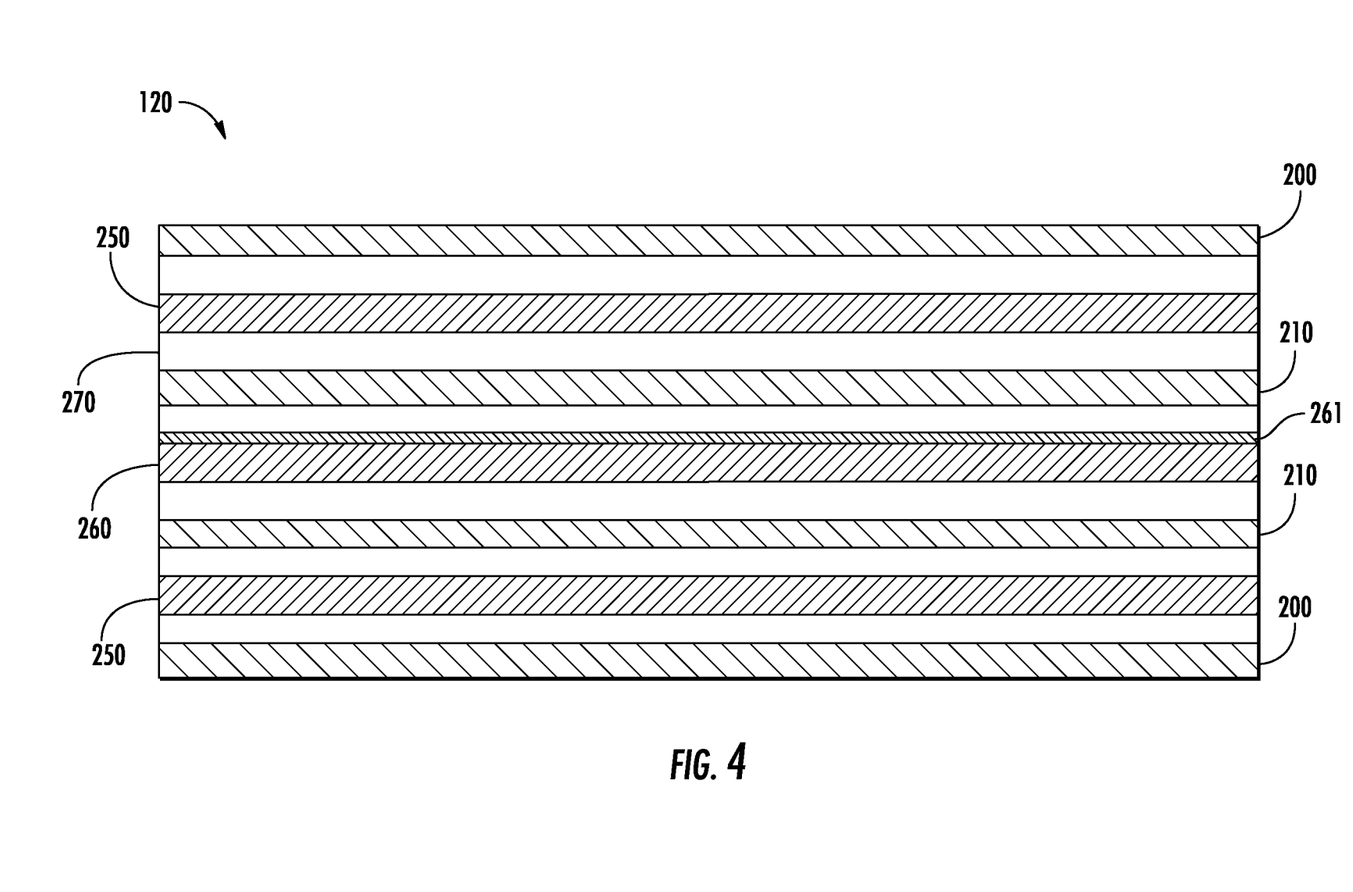
FIG. 4 shows a cross-section of one flex cable of the lower temperature wiring system.

While phosphor bronze has very low thermal conductivity, its electrical conductivity is also lower than copper by roughly a factor of ten. Therefore, at the colder stages, the active heat generated by the signal traces may exceed desired levels. Therefore, at the colder stages, a lower temperature wiring system 120 may be deployed. FIG. 4 shows a cross-section of this lower temperature wiring system 120 according to one embodiment. All components that are similar to those in FIG. 3 have been given identical reference designators. In this wiring system, a tin-lead solder layer 261 is applied to the inner conductive layer 260 using a hot air solder leveling (HASL) process. Other coating techniques, such as immersion tin, may also be used. The tin-lead solder layer 261 may have a thickness of about 0.3 mils (7.6 μm). The tin-lead solder is superconducting at temperatures below about 5K. In other embodiments, a different superconducting material can be used, such as a tin plating layer.

In certain embodiments, the lower temperature wiring system 120 may be thicker than the higher temperature wiring system 110 due to the inclusion of the tin-lead solder layer 261. In other embodiments, the thickness of the two wiring systems is kept constant by slightly reducing the thickness of the adhesive layers 270 and/or the flexible layers in the lower temperature wiring system.

In certain embodiments, the outer flexible layers 200 may be omitted from the flex cable in the lower temperature wiring system 120. In these embodiments, the flex cable comprises two interior flexible layers 210, an inner conductive layer 260, the tin-lead solder layer 261, and one or more adhesive layers 270. As described above, the signal traces 265 are created on the inner conductive layer 260.

Referring to FIG. 3, the flex cables in the high density wiring system 100 may broaden at its ends. Contact pads 266 may be created near the ends of the flexible layers, which are used for connections to connectors, as described in more detail below.

Figure 5:
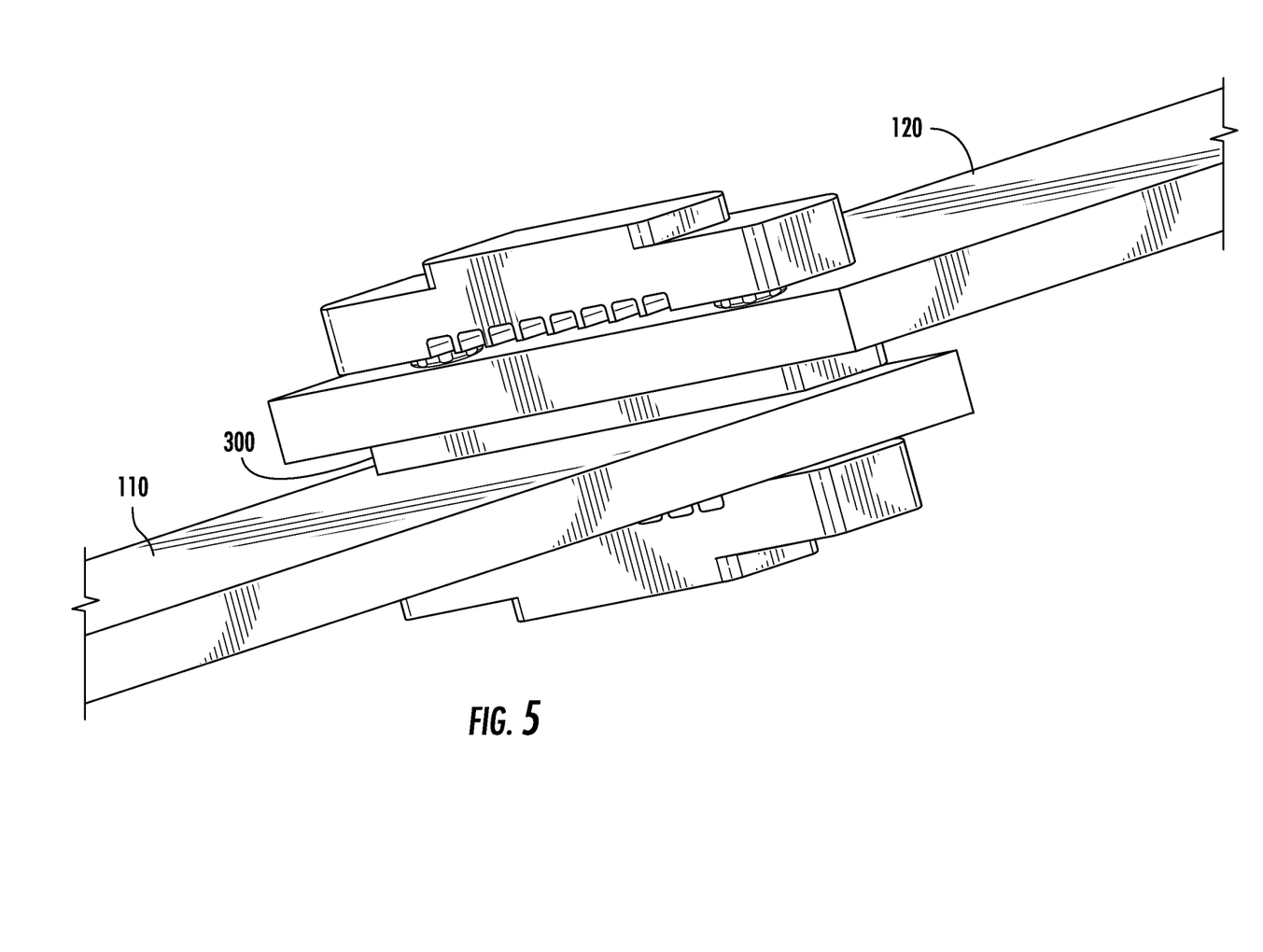
FIG. 5 shows a connector used to connect two flex cables according to one embodiment.

In certain embodiments, standard connectors, such as those shown in FIG. 5, may be used to connect two wiring systems. For example, the standard connector 300 may be used to connect a flex cable in the higher temperature wiring system 110 to a flex cable in the lower temperature wiring system 120. This standard connector 300 may also be used to connect like wiring systems, such as two higher temperature wiring systems 110 or two lower temperature wiring systems 120.

Figure 6:
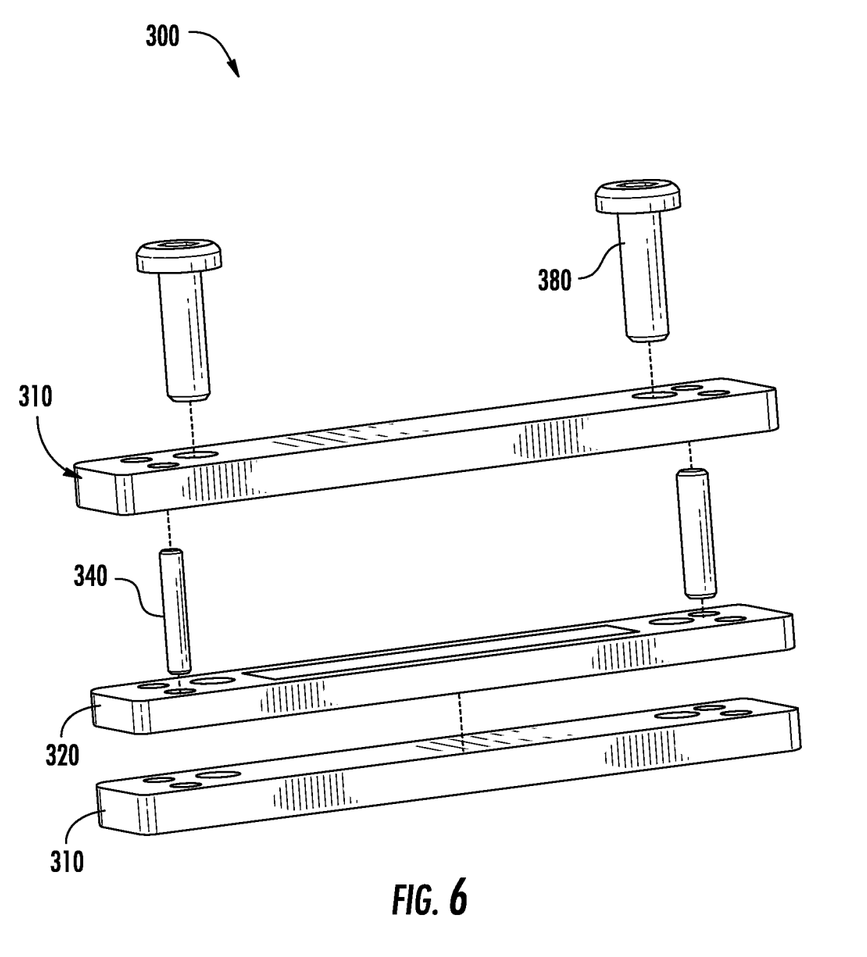
FIG. 6 shows an exploded view of the connector of FIG. 5.

FIG. 6 shows an exploded view of the standard connector 300. The standard connector 300 comprises two stiffeners 310. These components are used to add structural support. Between the stiffeners 310 is the electrical interconnect between the flex cables in the two wirings systems. In certain embodiments, the electrical interconnect comprises electrical contacts, which are contained within an insulating housing 320.

The flex cables associated with the two wiring systems to be connected are each disposed between the electrical interconnect and a respective stiffener 310. The standard connector 300 may be held together using fasteners 380. The fasteners 380 pass through one stiffener 310 and may be secured by tapped holes in the other stiffener 310. In certain embodiments, metal dowels 340 may be used to align the flex cables to the standard connector 300.

Figure 7A:
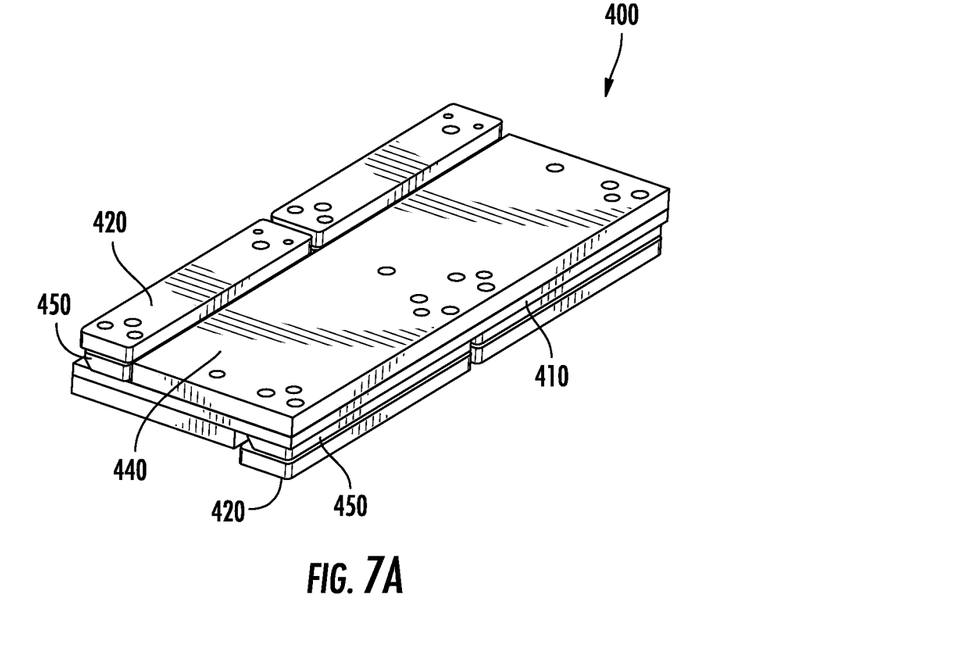
FIGS. 7A-7B show a filter board according to one embodiment.
Figure 7B:
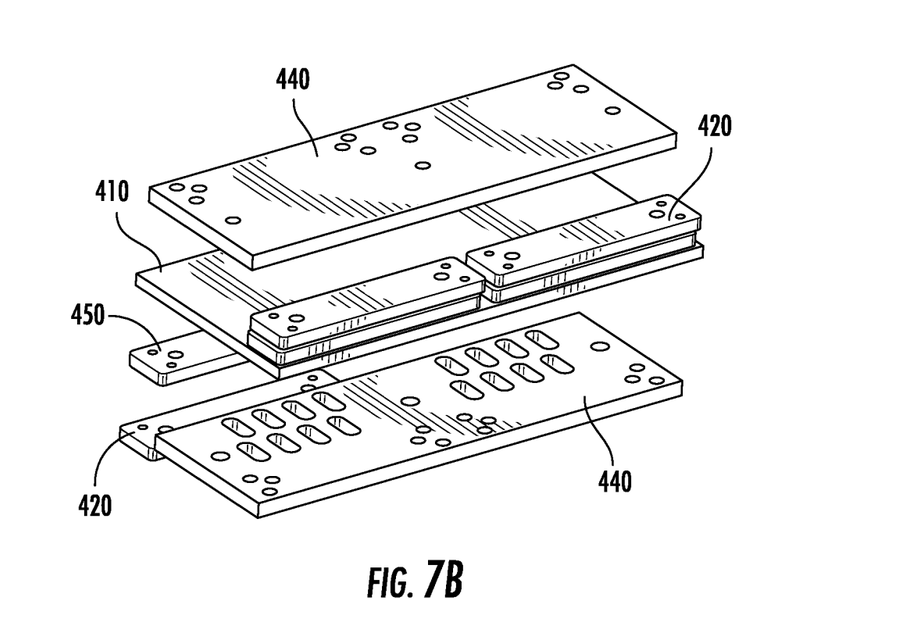

In certain embodiments, the connection between two flex cables in the high density wiring system 100 may include additional functionality. For example, FIGS. 7A-7B show a filter board 400. The filter board 400 comprises one or more printed circuit boards 410, each comprising signal traces and pads to which filter components, such as capacitors and resistors, may be soldered. Copper shields 440 may be used to shield the filter components on the printed circuit board 410 and provide tapped holes for the fasteners. In certain embodiments, there may be two copper shields 440 associated with each connection; one on a top surface and one on a bottom surface. The copper shields 440 may provide structural support to the printed circuit board 410. The filter board 400 also includes stiffeners 420 that are used to provide structural support to the flex cables in the high density wiring system. Standard connectors 450 are disposed on opposite ends of the filter board 400. In certain embodiments, each signal trace is in communication with a low pass filter, such as a 150 MHz low pass filter. The flex cables (not shown) are each sandwiched between a respective stiffener 420 and a standard connector 450. In this way, the conductive path is through the flex cable in the first wiring system, the standard connector 450, the printed circuit board 410, a second standard connector 450 and to the flex cable in the second wiring system.

In some embodiments, the filter boards 400 are installed at the stage that is maintained at 4K. In the example in FIG. 1A, the filter boards may be installed near the second stage 20 in the second inter-stage region 25. The high density wiring system may also transition from the higher temperature wiring system 110 to the lower temperature wiring system 120 at this point as well.

While FIG. 3 shows a top view of a flex cable with 32 signals, the high density wiring system 100 is not limited to this embodiment. For example, the flex cables may be made wider so that each flex cable is able to carry more signals. Further, a plurality of these flex cables may be arranged in parallel to carry more signals through the stages of the dilution refrigerator. For example, in one embodiment, eight of these flex cables are used in parallel, so as to carry 256 signals through the stages of the dilution refrigerator 10.

In some embodiments, the interface between some of the stages of the dilution refrigerator may be separated by the use of a vacuum flange. For example, a vacuum flange may be installed in a 4" diameter ISO100 port and separate two stages. For example, a vacuum flange may be installed at the outermost stage.

In certain embodiments, the high density wiring system 100 described herein is designed to fit through this standard 4" diameter ISO100 port. Further, the number of signals that may be carried using this high density wiring system 100 may be 256 or more. In certain embodiments, up to 1000 signals may be carried using this approach. For example, by using eight of the flex cables shown in FIG. 3, a total of 256 signals may be carried between stages. By using wider flex cables or additional flex cables in parallel, up to 1000 signals may be carried.

In certain embodiments, it may be beneficial to hermetically seal these flex cables. In one embodiment, the flex cable, or a portion of the flex cable may be encased in an epoxy to seal it.

While the high density wiring system is described in the context of a dilution refrigerator, it is understood that this high density wiring system may be used with cryogenic sensors as well as cryogenic infrastructure.

The present system has many advantages. The superconducting flex cable technology that has been developed for connections between the lower-temperature stages of the dilution refrigerator (4K to 20 mK) is unique. Superconducting cables are essential for maintaining a low active heat load when sending a large number of mA level currents to the sensitive low-temperature stages of the fridge. Superconducting cables also have lower RF losses compared to normal metal cables. There is significant interest in developing flex cables using only superconducting metals (such as Nb or NbTi), but research and development efforts in this direction have faced significant manufacturing challenges. Instead, the present disclosure presents a reliable and effective solution based a superconducting solder plating applied to a normal metal base layer. These flex cables are designed with a phosphor-bronze base metal, chosen for its low thermal conductivity, which is then plated with superconducting tin/lead solder using a hot air solder leveling (HASL) process. Other coating techniques, such as immersion tin, may also be used. Dunk testing was performed in liquid helium to demonstrate that these flex cables are indeed superconducting, and they have been successfully installed in a dilution refrigerator and used to control a quantum computing testbed device. Further, the high density wiring system disclosed herein may be used to carry more than 1000 signals in the dilution refrigerator. This may be accomplished using a plurality of flex cables, where each flex cable comprises 32 or more signal traces.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A flexible wiring system for use within a dilution refrigerator, comprising:
    a flex cable comprising two interior flexible layers between which signal traces are disposed, wherein the signal traces comprise phosphor bronze coated with a superconducting material.

2. The flexible wiring system of claim 1, wherein the superconducting material comprises a tin-lead solder layer applied using a hot air solder leveling (HASL) process.

3. The flexible wiring system of claim 1, further comprising two outer flexible layers sandwiching the two interior flexible layers, wherein outer conductive layers are disposed between each outer flexible layer and an adjacent interior flexible layer.

4. The flexible wiring system of claim 3, wherein the outer conductive layers are made of phosphor bronze and act as ground planes.

5. The flexible wiring system of claim 1, wherein the signal traces have a bandwidth of at least 50 MHz.

6. The flexible wiring system of claim 1, wherein isolation between signal traces is greater than 40 dB.

7. The flexible wiring system of claim 1, wherein each signal trace is configured to carry at least 3 mA of current.

8. A flexible wiring system for use within a dilution refrigerator, wherein the dilution refrigerator comprises a plurality of stages, each at a different temperature, separated by inter-stage regions, the flexible wiring system comprising:
    one or more flex cables in a higher temperature wiring system used in stages and inter-stage regions having a temperature above a threshold temperature, wherein the one or more flex cables in the higher temperature wiring system comprise two interior flexible layers wherein signal traces are disposed between the two interior flexible layers;
    one or more flex cables in a lower temperature wiring system used in stages and inter-stage regions having a temperature less than the threshold temperature, wherein the one or more flex cables in the lower temperature wiring system comprise two interior flexible layers wherein signal traces are disposed between the two interior flexible layers and are made of phosphor bronze; and
    a connector to connect the one or more flex cables in the higher temperature wiring system and the one or more flex cables in the lower temperature wiring system.

9. The flexible wiring system of claim 8, wherein the threshold temperature is between 3K and 5K.

10. The flexible wiring system of claim 8, wherein the signal traces in the higher temperature wiring system are made of phosphor bronze.

11. The flexible wiring system of claim 10, wherein the signal traces have a bandwidth of at least 50 MHz.

12. The flexible wiring system of claim 10, wherein isolation between signal traces is greater than 40 dB.

13. The flexible wiring system of claim 10, wherein each signal trace is configured to carry at least 3 mA of current.

14. The flexible wiring system of claim 10, wherein the one or more flex cables in the higher temperature wiring system and the one or more flex cables in the lower temperature wiring system each further comprise two outer flexible layers sandwiching the two interior flexible layers, wherein outer conductive layers are disposed between each outer flexible layer and an adjacent interior flexible layer, wherein the outer conductive layers are made of phosphor bronze and act as ground planes.

15. The flexible wiring system of claim 10, wherein the one or more flex cables in the lower temperature wiring system comprises a material disposed on the signal traces, and wherein the material is superconducting below the threshold temperature.

16. The flexible wiring system of claim 15, wherein the material is not disposed on the signal traces in the higher temperature wiring system.

17. The flexible wiring system of claim 15, wherein the material comprises a tin-lead solder layer.

18. The flexible wiring system of claim 15, wherein the material comprises a tin layer.

19. The flexible wiring system of claim 8, further comprising a filter board used to connect two adjacent flex cables, wherein the filter board comprises low pass filters.

20. The flexible wiring system of claim 8, wherein the one or more flex cables in the higher temperature wiring system and the one or more flex cables in the lower temperature wiring system each further comprise two outer flexible layers sandwiching the two interior flexible layers, wherein outer conductive layers are disposed between each outer flexible layer and an adjacent interior flexible layer, wherein the outer conductive layers are made of phosphor bronze and act as ground planes.

* * * * *